United States Patent
Ramamoorthy et al.

(10) Patent No.: US 9,274,967 B2
(45) Date of Patent: Mar. 1, 2016

(54) FIFO CACHE SIMULATION USING A BLOOM FILTER RING

(71) Applicant: Nimble Storage, San Jose, CA (US)

(72) Inventors: Senthil Kumar Ramamoorthy, Sunnyvale, CA (US); Umesh Maheshwari, San Jose, CA (US)

(73) Assignee: Nimble Storage, Inc., San Jose, CA (US)

( * ) Notice: Subject to any disclaimer, the term of this patent is extended or adjusted under 35 U.S.C. 154(b) by 461 days.

(21) Appl. No.: 13/961,706

(22) Filed: Aug. 7, 2013

(65) Prior Publication Data
US 2015/0046142 A1 Feb. 12, 2015

(51) Int. Cl.
| | |
|---|---|
| G06F 12/00 | (2006.01) |
| G06F 13/00 | (2006.01) |
| G06F 13/28 | (2006.01) |
| G06F 9/26 | (2006.01) |
| G06F 9/34 | (2006.01) |
| G06F 12/08 | (2006.01) |
| G06F 17/30 | (2006.01) |

(52) U.S. Cl.
CPC ........ *G06F 12/0866* (2013.01); *G06F 12/0802* (2013.01); *G06F 12/0862* (2013.01); *G06F 12/0875* (2013.01); *G06F 17/3033* (2013.01); *G06F 17/30781* (2013.01); *G06F 2212/601* (2013.01)

(58) Field of Classification Search
CPC ............ G06F 12/0866; G06F 12/0802; G06F 12/0875; G06F 12/0862; G06F 2212/601; G06F 17/30781; G06F 17/3033

USPC .................................. 711/133, 159, 216, 118
See application file for complete search history.

(56) References Cited

U.S. PATENT DOCUMENTS

| | | | |
|---|---|---|---|
| 6,920,477 B2 | 7/2005 | Mitzenmaucher | |
| 2006/0294311 A1* | 12/2006 | Fu et al. ......................... | 711/118 |
| 2008/0155229 A1* | 6/2008 | Beyer et al. ................... | 711/216 |
| 2010/0332765 A1* | 12/2010 | Cypher .......................... | 711/141 |

OTHER PUBLICATIONS

Cao, Pei, "Bloom Filters—the math" (Jul. 15, 2008) 6 pgs.
Surprenant, Colin, "Continuous Bloom Filter" (May 12, 2012) 5 pgs.
Kulkarni, Purushottam et al., "Scalable Techniques for memory-efficient CDN Simulations", WWW2003, May 20-24, 2003, Budapest, Hungary. 10 pgs.

* cited by examiner

*Primary Examiner* — Mark Giardino, Jr.
*Assistant Examiner* — Shane Woolwine
(74) *Attorney, Agent, or Firm* — Ascenda Law Group, PC

(57) ABSTRACT

Described herein are methods, systems and machine-readable media for simulating a FIFO cache using a Bloom filter ring, which includes a plurality of Bloom filters arranged in a circular log. New elements are registered in the Bloom filter at the head of the circular log. When the Bloom filter at the head of the circular log is filled to its capacity, membership information associated with old elements in the Bloom filter at the tail of the circular log is evicted (simulating FIFO cache behavior), and the head and tail of the log are advanced. The Bloom filter ring is used to determine cache statistics (e.g., cache hit, cache miss) of a FIFO cache of various sizes. In response to simulation output specifying cache statistics for FIFO cache of various sizes, a FIFO cache is optimally sized.

12 Claims, 9 Drawing Sheets

Bloom filter initialized to all zeros:

| 0 | 0 | 0 | 0 | 0 | 0 | 0 | 0 | 0 | 0 |
|---|---|---|---|---|---|---|---|---|---|
| 1 | 2 | 3 | 4 | 5 | 6 | 7 | 8 | 9 | 10 |

120

Bloom filter after registering element 'x':

| 0 | 1 | 0 | 1 | 0 | 0 | 0 | 0 | 1 | 0 |
|---|---|---|---|---|---|---|---|---|---|
| 1 | 2 | 3 | 4 | 5 | 6 | 7 | 8 | 9 | 10 |

122

Bloom filter after registering element 'y':

| 0 | 1 | 0 | 1 | 0 | 1 | 1 | 0 | 1 | 0 |
|---|---|---|---|---|---|---|---|---|---|
| 1 | 2 | 3 | 4 | 5 | 6 | 7 | 8 | 9 | 10 |

FIFO CACHE SIMULATION USING A BLOOM FILTER RING

FIELD OF THE INVENTION

The present invention relates to methods, systems and machine-readable media for simulating a FIFO cache using a Bloom filter ring, and more particularly relates to techniques for estimating cache statistics of a FIFO cache.

BACKGROUND

In a hybrid data storage system, hard disk drives (HDDs) and solid state drives (SDDs) are used together to efficiently store data. HDDs are typically the final end point for data (i.e., permanently storing data until a host instructs the data to be deleted), while SSDs are used for caching data (e.g., temporarily storing data that is used by the host on a more frequent basis or temporarily storing data based on other heuristics). One type of cache design that is employed in such hybrid data storage systems is a first-in-first-out (FIFO) cache, in which a data element that is first stored is the first one that is deleted when the FIFO cache becomes full (or is nearing its capacity).

Determining the proper size of the FIFO cache is critical for the performance of such systems. A FIFO cache sized too large may unnecessarily increase the cost of a storage system, while a FIFO cache sized too small may result in many cache misses, increasing the overall time it tasks a host to access the storage system.

SUMMARY OF THE INVENTION

In one embodiment, methods, systems and machine-readable media are provided to determine the optimal size of a FIFO cache. The inventors propose using a Bloom filter ring, which closely mimics the behavior of a FIFO cache, to simulate a FIFO cache. While a FIFO cache stores actual elements (i.e., stores the content of an element at a specific address), a Bloom filter ring only stores the membership of an element (e.g., hash of the element address or element content). As a result, a Bloom filter ring consumes orders of magnitude less memory than an actual FIFO cache.

A Bloom filter ring is a plurality of conventional Bloom filters arranged in a circular log. A hash of an element is inserted into the Bloom filter at the head of the circular log. If the Bloom filter at the head of the log is filled to its capacity, the head and tail of the log advance, and membership of elements of the Bloom filter indicated by the tail are evicted from the simulated cache. Such eviction mimics the behavior of a FIFO cache in which old (or stale) elements are evicted when the FIFO cache needs to make room for new elements.

In the simulation of a FIFO cache, a stream of cache accesses is received. Cache reads and cache writes are processed differently. In a cache read, the Bloom filter ring (i.e., each Bloom filter thereof) may be queried for the membership of the element that is the subject of the cache read. Membership of an element may be determined by the match (or the lack thereof) of the hash of an element in each Bloom filter of the Bloom filter ring. Membership of the element in any of the Bloom filters may be recorded as a cache hit, whereas the lack of membership in all of the Bloom filters may be recorded as a cache miss. In a cache write, the Bloom filter ring (i.e., each Bloom filter thereof) may be queried for the membership of the element that is the subject of the cache write, and if the element is not yet a member, adding membership of the element into the Bloom filter ring.

In one embodiment of the invention, an element (e.g., data block) includes content stored at a particular address. Depending on the implementation, the address of the element could be a physical address of where the element resides, could be the logical block address within a volume combined with the volume ID, or more generally could be any unique identifier of the element. The hash of an element may include the hash of the address associated with the element. Alternatively or in addition, the hash of an element may include the hash of the content associated with the element.

At the end of the simulation of the FIFO cache, a cache hit (or cache miss) percentage may be determined. The simulation may be repeated for FIFO caches of other sizes. A human operator or an automated process may determine an optimal cache size based on a data corresponding cache size to cache statistics (e.g., cache size or cache miss).

In one embodiment of the invention, the stream of cache accesses may be sampled, and the simulation only processes sampled ones of the cache accesses. Such sampling reduces the CPU and memory load of the simulator, and if sampled for a long enough interval, the stream of sampled cache accesses is an adequate representation of the original dataset (i.e., adequate for the cache statistic analysis).

These and other embodiments of the invention are more fully described in association with the drawings below.

BRIEF DESCRIPTION OF THE DRAWINGS

The present invention is illustrated by way of example, and not limitation, in the figures of the accompanying drawings in which:

FIG. 4 depicts an exemplary Bloom filter, and modifications to the Bloom filter as the membership of elements is inserted therein;

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

Figure 1:
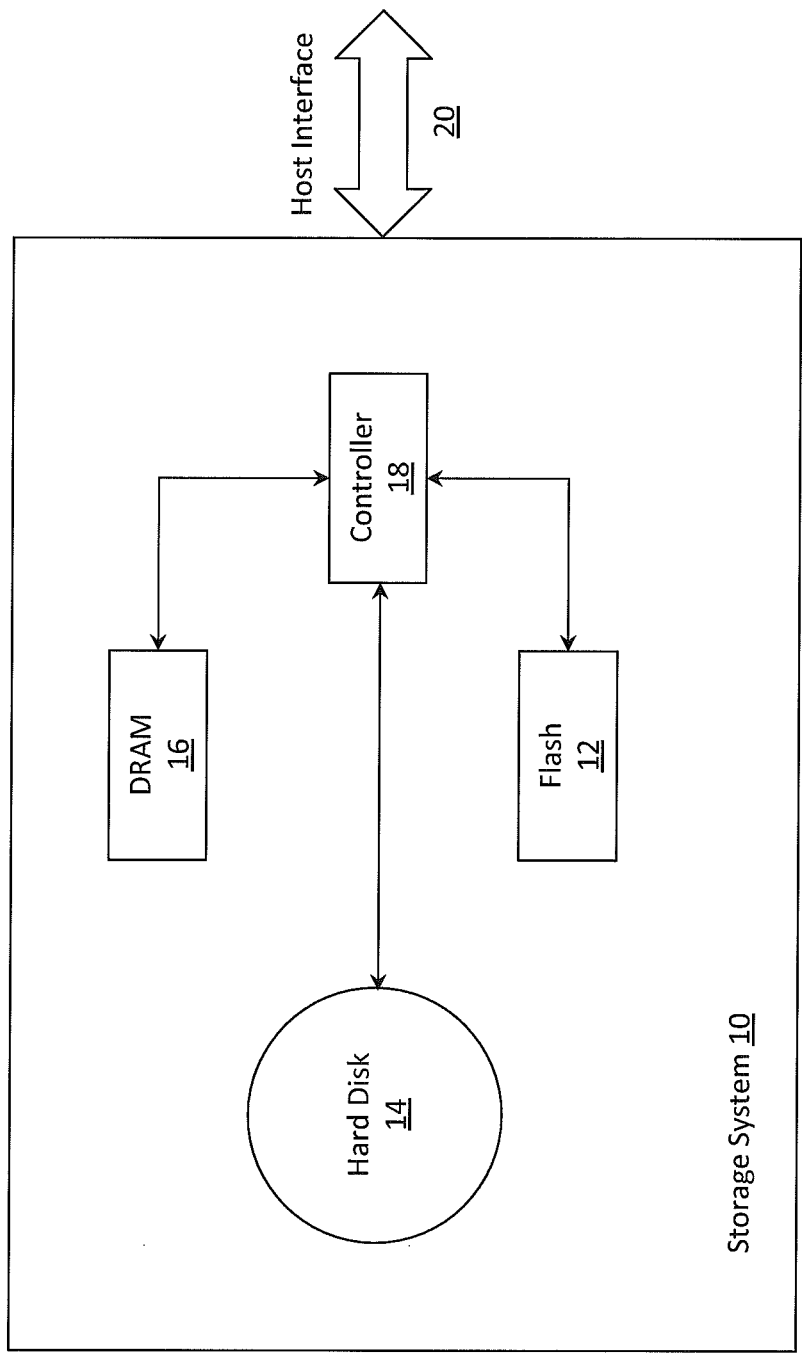
FIG. 1 depicts a storage system, within which embodiments of the present invention may be employed.

FIG. 1 depicts components of storage system 10, such storage system representative of a hybrid data storage system with hard disk 14 and flash 12. In FIG. 1, controller 18 is communicatively coupled to hard disk 14, flash 12 and dynamic random-access memory (DRAM) 16. Flash 12 (or more specifically flash-based cache) is typically used to temporarily store a copy of data (e.g., the selection of what data to cache being based on access frequency or other heuristics), whereas hard disk 14 is typically used to permanently store data (i.e., storing data until the host explicitly instructs the hard disk to delete the data). Storage system 10 is configured to store data for a host system (not depicted) via host interface 20.

Hard disk 14, also known as a hard disk drive (HDD), uses rapidly rotating disks coated with a magnetic material to store data in the form of magnetically encoded information elements. Flash 12, or more generally a solid-state device (SSD), uses a micro-electronic chip with no moving parts to store data. Hard disk 14 typically offers a larger storage capacity than flash 12. Hard disk 14 also has the advantage of typically being lower cost as compared to flash 12. On the other hand, flash 12 offers much faster read/write access than hard disk 14.

One goal of the present invention is to properly size flash 12. While techniques of the present invention can be applied when initially assembling storage system 10 (i.e., choosing proper cache size at the time of assembly), techniques of the present invention can also be applied after storage system 10 has been deployed in the field. For instance, techniques of the present invention can be applied to determine how much cache to add to a storage system that has an unacceptably high cache miss rate.

Figure 2:
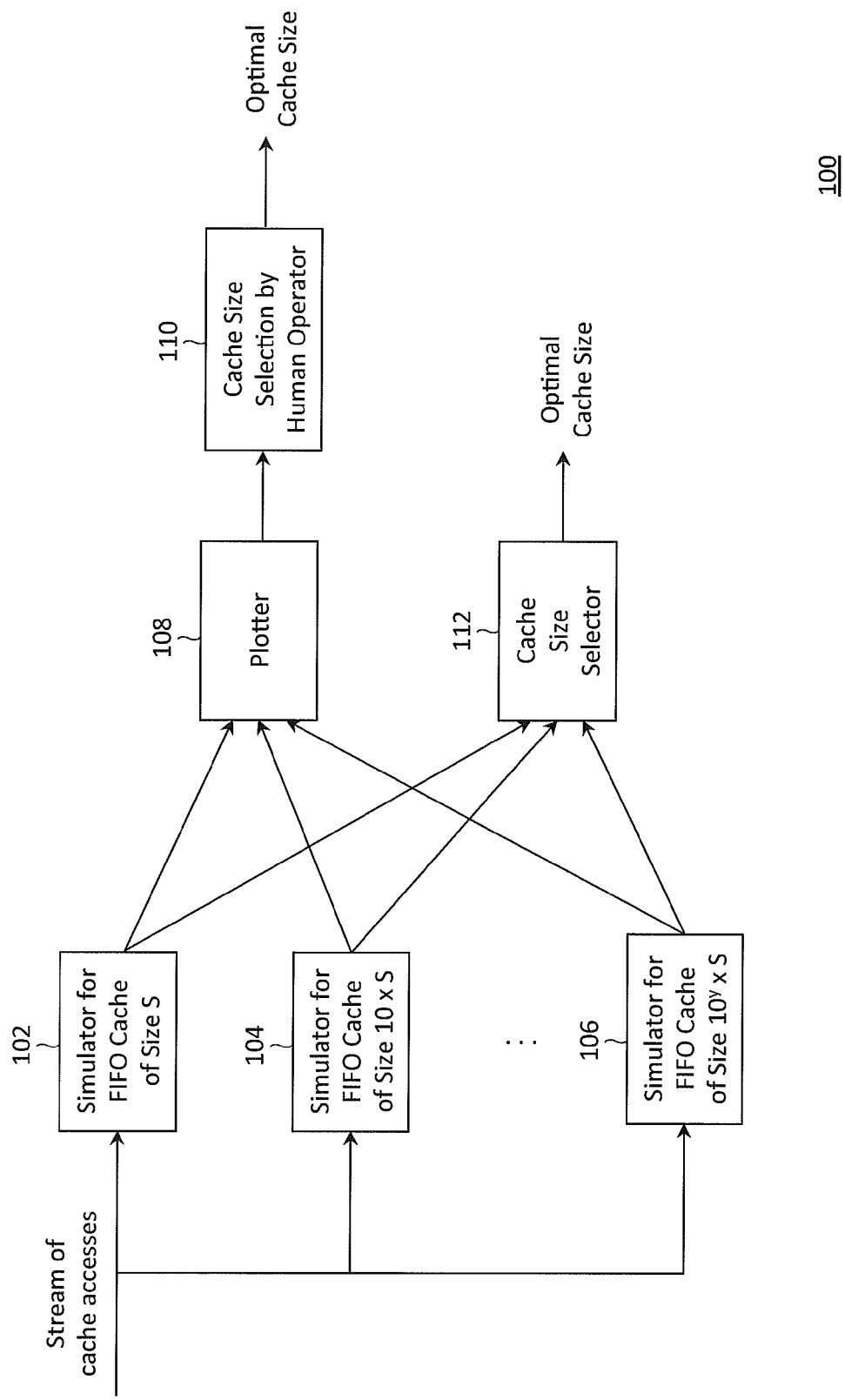
FIG. 2 depicts a signal flow diagram of a system that can be used to size a FIFO cache, in accordance with one embodiment of the invention.

FIG. 2 depicts a signal flow diagram of system 100 that can be used to size flash 12. System 100 takes as input a stream of cache accesses. Such stream could be an actual stream of cache accesses by host devic(es) of an enterprise. Such stream could also be a sampled version of an actual stream of cache accesses by host devic(es) of an enterprise. For instance, the stream of cache accesses could include one out of every five cache accesses by host devic(es) of an enterprise.

In one embodiment of the invention, such stream of cache accesses is provided as input to a bank of FIFO cache simulators (102, 104, 106), each simulator simulating a FIFO cache of a certain size. In the example of FIG. 2, the FIFO caches include size S, size 10×S, . . . , and size $10^y$×S, where y is an integer value. Of course, other cache sizes may be simulated in other embodiments of the invention. The simulations of the plurality of simulators may occur in parallel. Alternatively, only one FIFO cache simulator may be present, such simulator reconfigured over time to simulate a FIFO cache of size S, then a FIFO cache of size 10×S, and so on.

Figure 3:
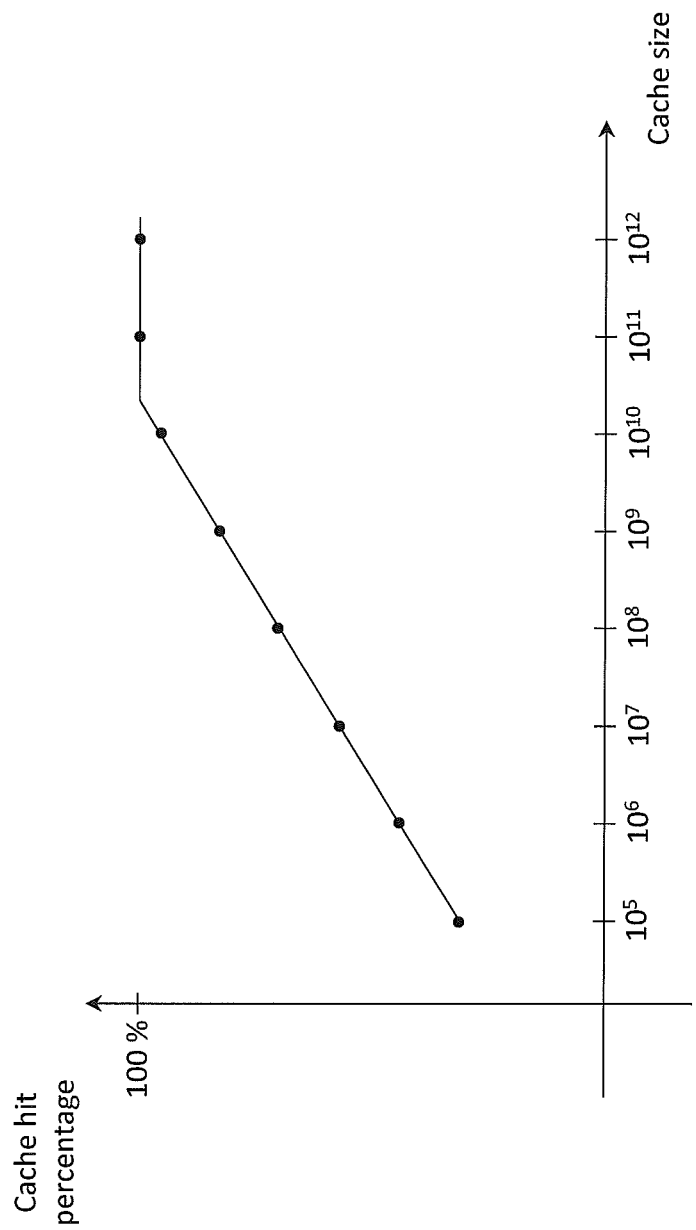
FIG. 3 depicts an exemplary plot of cache hit percentage versus cache size.

The output of each FIFO cache simulator includes one or more cache statistics, such as a cache hit percentage and a cache miss percentage. Such statistics (coupled to a certain cache size) is provided to plotter 108, which may produce a plot of cache hit percentage versus cache size. An example of such plot is provided in FIG. 3. As is expected, the cache hit percentage increases with increasing cache size. After a certain cache size (about $10^{10}$ bytes in the example of FIG. 3), the cache hit percentage levels off at 100%, indicating no further benefits to increased cache size. A human operator may view the plot produced by plotter 108 (abstractly represented by module 110 FIG. 2) and determine an optimal cache size. In FIG. 3, the optimal cache size may be determined as $10^{11}$ bytes.

In another embodiment of the invention, the cache sizing may be an automated process. A cache size selector 112 may take as input the cache statistics and automatically determine an optimal cache size.

FIGS. 4-8 describe the construction and operation of one of the FIFO cache simulators. FIG. 4 provides some background information regarding Bloom filters, which may by helpful in the discussion of a FIFO cache simulator. A Bloom filter is a data structure that is used to test whether an element is a member of a set. In the case of a FIFO cache simulator, a Bloom filter generally is used to test whether a data element is a member of the simulated cache. If a Bloom filter is queried for a data element, and the Bloom filter indicates the membership of same, a cache hit may be recorded. If a Bloom filter is queried for a data element, and the Bloom filter indicates the lack of membership of same, a cache miss may be recorded.

A Bloom filter, more specifically, is formed by a linear array of bits that store membership information of elements. Typically, the elements themselves are not stored in the Bloom filter, only the membership thereof. FIG. 4 provides some examples of a Bloom filter for clarity. At the top of FIG. 4, Bloom filter 120 (with only 10 bits for simplicity of explanation) is initialized to all zeros. To register element 'x' (i.e., make element 'x' a member of the Bloom filter), a hash of element 'x' is computed. While there may be many techniques to perform the hash computation, what is important is that the hash operation maps an element to a plurality of array positions (the number of array positions an element is mapped to will be denoted b for the present discussion). In the present example, assume element 'x' is mapped to array positions 2, 4 and 9. To register element 'x', array positions 2, 4 and 9 are set to 1, as shown in Bloom filter 122.

To determine the membership of an element, a similar process is performed. If one desires to determine the membership of element 'x', one computes the hash of element 'x', which produces array positions 2, 4 and 9. One then determines whether the Bloom filter at array positions 2, 4 and 9 are set to 1. If so, the membership of element 'x' is confirmed. Otherwise, it is concluded that element 'x' is not a member.

In FIG. 4, element 'y' is also registered into the Bloom filter. Element 'y' is mapped (or "hashed") to array positions 2, 6, 7, and accordingly these array positions 2, 6, 7 are set to 1, as shown in Bloom filter 124. It is noted that the array position 2 is common to the hash of elements 'x' and 'y', but poses no issues for the Bloom filter.

FIG. 4 will now be used to illustrate the concept of false positives associated with a Bloom filter. Suppose the membership of element 'z' is queried, in which element 'z' is hashed to array positions 4, 7 and 9. Element 'z' is not a member of the Bloom filter (i.e., membership of same was never recorded in the Bloom filter). Nevertheless, upon determining array positions 4, 7 and 9 are all set to 1 (i.e., in Bloom filter 124), the Bloom filter will return that element 'z' is a member, resulting in a false positive (i.e., an element testing for positive membership, even though it is not actually a member). It is noted that the rate of false positives will increase with increasing elements being registered in the Bloom filter (i.e., as more bits will be set to 1). Also, the rate of false positives will decrease with increasing Bloom filter size (i.e., a Bloom filter with more bits will on average have less false positives than a Bloom filter with fewer bits, keeping all other factors constant). Typically, false positives are an unwanted behavior of Bloom filters, but in some cases are a worthwhile compromise to the benefits of using Bloom filters, such as constant time look-up and a memory efficient design.

As another characteristic, Bloom filters have no false negatives, as the hash of an element having no match in a Bloom filter (i.e., array positions of hash not all being 1) will conclusively mean that the element is not a member of the Bloom filter.

Another characteristic of Bloom filters (at least in the most basic Bloom filters) is that the membership of an element typically cannot be withdrawn from a Bloom filter (i.e., once an element is registered in the Bloom filter, its registration cannot be removed). Returning to the example of FIG. 4, one might attempt to remove the membership of element 'x' from Bloom filter 124 by setting array positions 2, 4 and 9 (i.e., corresponding to the hash of element 'x') to 0. If this were performed, it is observed that the membership of 'y' will inadvertently be removed, as the membership of 'y' is represented by array positions 2, 6 and 7 all being set to 1. To maintain a zero probability for false negatives, the membership of an element typically is not withdrawn from a Bloom filter.

The inability to withdraw the membership of elements poses a problem for the simulation of a FIFO cache, as a FIFO cache requires the removal of elements. Recall, in a FIFO cache, old (or stale) elements are removed from the FIFO cache, as the FIFO cache fills up and space is made for new elements. A modified version of a Bloom filter is now discussed which allows the behavior (particular the deletion of elements) of a FIFO cache to be simulated.

Figure 5:
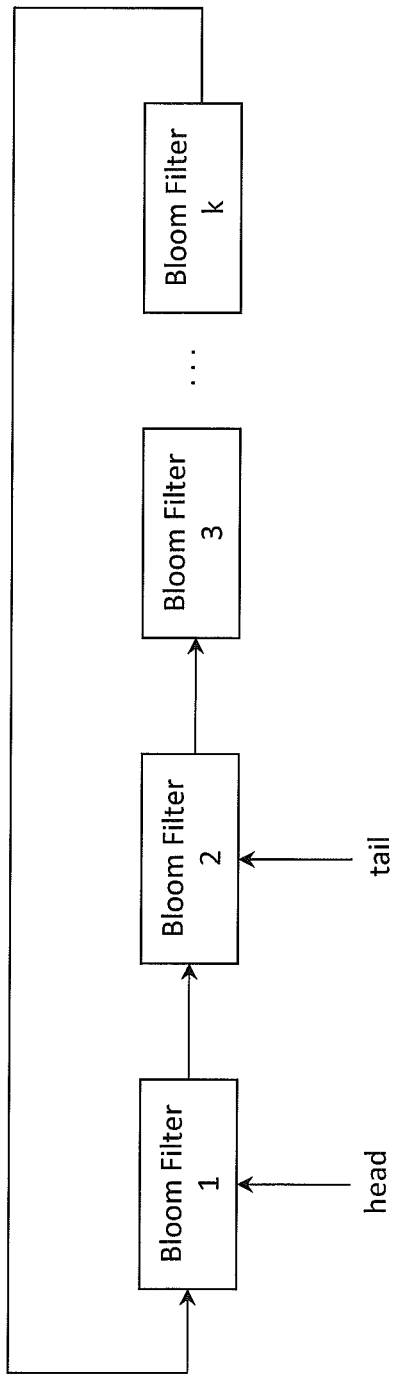
FIG. 5 depicts an exemplary Bloom filter ring.
Figure 6:
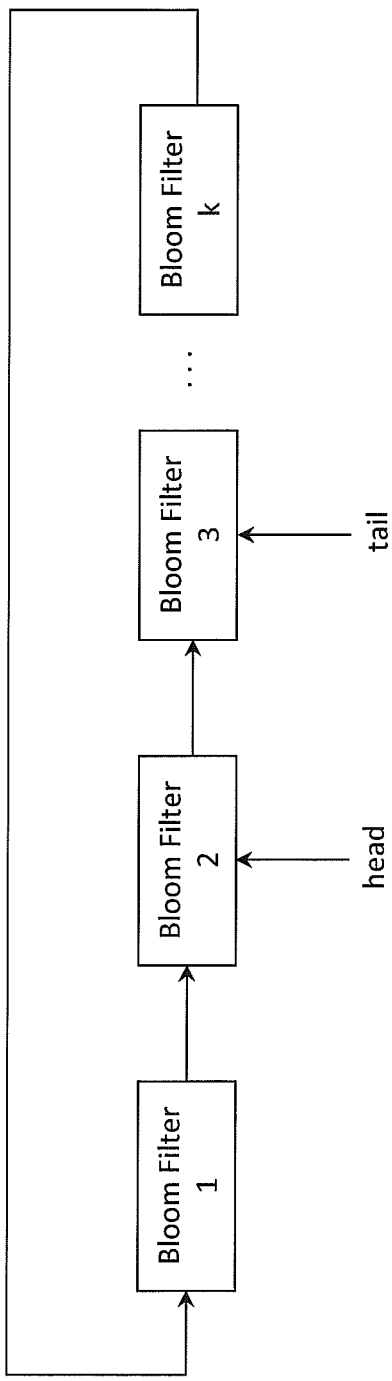
FIG. 6 depicts an exemplary Bloom filter ring, with head and tail pointers that have been advanced relative to FIG. 5.

FIG. 5 depicts a Bloom filter ring with k Bloom filters arranged in a circular log. Conceptually, one can view the k Bloom filters as a conventional Bloom filter divided into k portions. If a conventional Bloom filter is sized to store N elements, each of the k Bloom filters is sized to store N/k elements (assuming that N/k is an integer or rounding N/k to the nearest integer if N/k is a non-integer value). If N=100, and k=10, each of the k Bloom filters would be sized to store 10 elements.

The Bloom filter ring includes a head pointer and tail pointer associated with two adjacent ones of the Bloom filters. In the example of FIG. 5, the head pointer is associated with Bloom filter 1 and the tail pointer is associated with Bloom filter 2. Elements are registered (i.e., storing membership thereof) into the Bloom filter indicated by the head pointer. When the Bloom filter indicated by the head pointer is filled to its capacity (e.g., Bloom filter is sized to store the membership of 10 elements, and the membership of 10 elements has been stored), the Bloom filter indicated by the tail pointer is cleared (i.e., all bits are set to 0) to make room for registering new elements, and the head and the tail pointer are advanced. In the example of FIG. 5, the head pointer is advanced from Bloom filter 1 to Bloom filter 2 and the tail pointer is advanced from Bloom filter 2 to Bloom filter 3 (the Bloom filter ring after such advancement operation depicted in FIG. 6).

It is noted that the above description may describe the steady state behavior of the head and tail pointers. The manipulation of the head and tail pointers may differ during the initial use of the Bloom filter ring. In a Bloom filter ring with 5 Bloom filters, the head pointer may initially point to Bloom filter 1 and the tail pointer may point to Bloom filter 5. When Bloom filter 1 is filled to its capacity, the head pointer may advance to Bloom filter 2. When Bloom filter 2 is filled to its capacity, the head pointer may advance to Bloom filter 3, and so on. When the head pointer starts to collide with the tail pointer, the tail pointer may start to also advance. The collision of the head and tail pointer may commence the steady state behavior of the head and tail pointers. For example, when Bloom filter 4 is filled to its capacity, the head pointer may advance to Bloom filter 5, and the tail pointer may advance to Bloom filter 1. When Bloom filter 5 is filled to its capacity, the head pointer may advance to Bloom filter 1, and the tail pointer may advance to Bloom filter 2, and so on.

The circular log construction allows the membership of old elements to be deleted in batches, mimicking the behavior of a FIFO cache, in which old (or stale) elements are deleted to make room for new elements.

It is noted that the value of k has important effects on the behavior of the Bloom filter. Small values of k result in the membership of old elements being deleted in large batches. Suppose N=100 elements and k=2, so that 2 Bloom filters each hold 50 elements. Upon the Bloom filter indicated by the head pointer becoming full, the membership of all 50 elements in the Bloom filter indicated by the tail pointer would be deleted. Stated differently, small values of k lead to large fluctuations in the number of members maintained by the Bloom filter ring. Elements in a FIFO cache are typically not deleted in large batches, so utilizing small values of k would not accurately simulate the behavior of a FIFO cache.

Large values of k also have undesirable effects. Assuming that the false positive rate for each Bloom filter stays approximately constant with increasing k (i.e., while each Bloom filter has less bits with increasing k, each Bloom filter also stores a fewer number of elements, allowing the false positive rate for each Bloom filter to stay approximately constant with increasing k), the false positive rate for the Bloom filter ring increases with larger values of k, as can be observed from the following relationship:

$$f_{BF\text{-}ring} = 1 - (1 - f_{BF})^k, \quad \text{(Equation 1)}$$

where
$f_{BF\text{-}ring}$ is the false positive rate for a Bloom filter ring
$f_{BF}$ is the false positive rate for an individual Bloom filter within the Bloom filter ring, and
k is the number of Bloom filters in the Bloom filter ring.
A high false positive rate for the Bloom filter ring results in unreliable membership information being maintained by the Bloom filter ring, which is undesirable.

As a result, a moderate value of k (neither too small nor too large) is desired. The inventors have found that in practice a value for k of 10 is acceptable.

Figure 7:
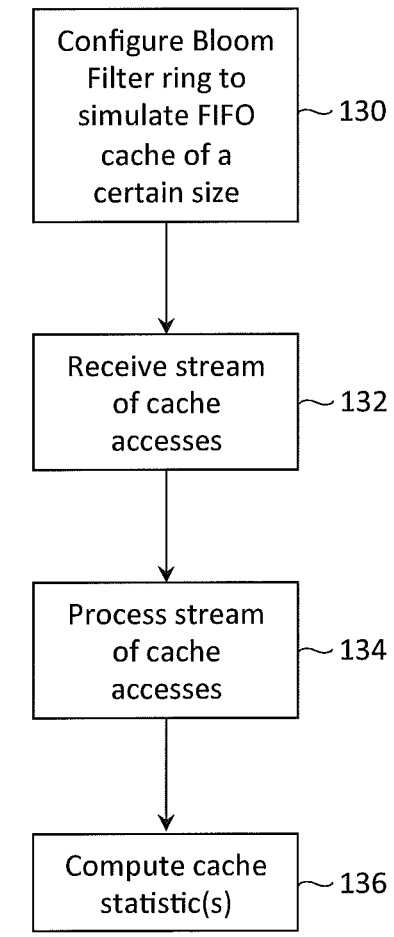
FIG. 7 depicts a process performed in the simulation of a FIFO cache, in accordance with one embodiment of the invention.

FIG. 7 depicts a process performed in the simulation of a FIFO cache of a certain size. First, in step 130, a Bloom filter ring is configured to simulate a FIFO cache of a certain size (e.g., size=S bytes). In step 132, a stream of cache accesses is received. In step 134, the stream of cache accesses is processed, such processing further described in FIG. 8. Finally, in step 136, cache statistic(s) (e.g., cache hit percentage, cache miss percentage) are computed, such cache statistic(s) associated with the FIFO cache of a certain size.

Returning to step 130, the critical parameter that needs to be configured for a Bloom filter ring is the number of bits for each Bloom filter, such parameter being calculated from a FIFO cache size of S bytes; $f_{BF\text{-}ring}$, the desired false positive rate for the Bloom Filter ring; and b, the number of array positions an element is mapped to (which could be the number of hash functions per Bloom filter). First, the FIFO cache size of S bytes is mapped into a number of elements, N, that the cache can accommodate. For instance, the mapping might involve a block size per element. Assuming a block size of 4 k bytes and a cache size of 1 terabyte (i.e., S=1 terabyte), that cache would accommodate 250 million elements (i.e., 1 terabyte divided by 4 k bytes). Next, the number of elements per Bloom filter (in a Bloom filter ring), n, is determined according to the relationship N/k (i.e., n=N/k). Supposing k=10, each Bloom filter would accommodate 25 million elements (i.e., n=25 million). Next, $f_{BF}$, the false positive rate for an individual Bloom filter within the Bloom filter ring, is calculated from $f_{BF\text{-}ring}$, the false positive rate for the Bloom filter ring, via equation 1. Suppose the desired false positive rate for the Bloom filter ring were 5% (i.e., $f_{BF\text{-}ring}$=5%), then it can be calculated from equation 1 that the false positive rate for an individual Bloom filter would be 0.51% (i.e., $f_{BF}$=0.51%). Finally, the number of bits per Bloom filter, m, can be calculated from, $f_{BF}$, the false positive rate for an individual Bloom filter; b, the number of array positions an element is mapped to; and n, the number of elements per Bloom filter according to the following relationship:

$$f_{BF} = \left(1 - \left(1 - \frac{1}{m}\right)^{bn}\right)^b \quad \text{(Equation 2)}$$

For $f_{BF}$=0.51%, b=4, and n=25 million, the number of bits per Bloom filter is 321 million bits (i.e., m=321 million bits), or around 13 bits per element. Such calculations (and the values for the various parameters) are exemplary in nature and other calculations may be used to arrive at the number of bits per Bloom filter (e.g., calculations involving different formulas, a different order of calculations, etc.).

Figure 8:
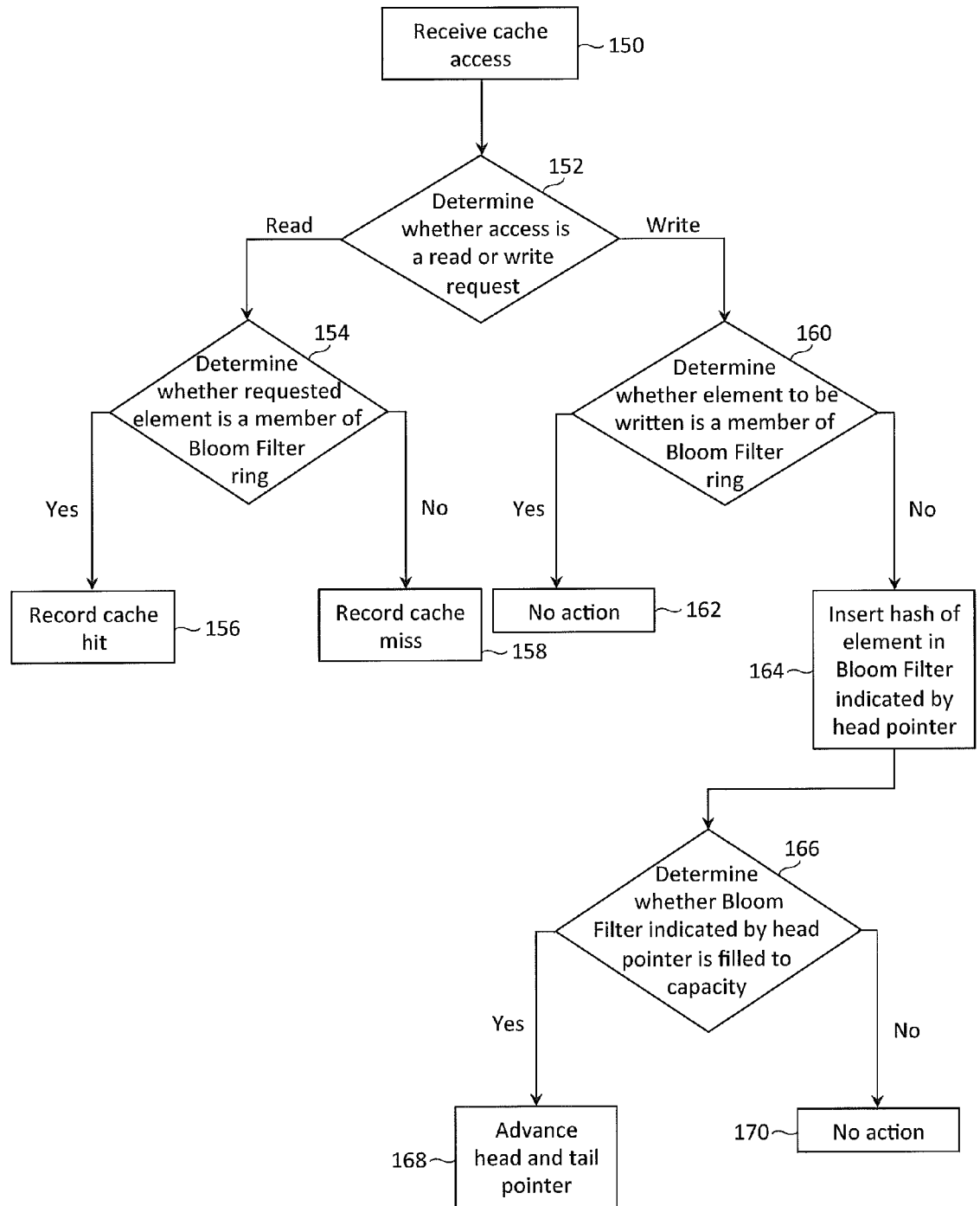
FIG. 8 depicts a flow chart associated with the processing of a cache access, in accordance with one embodiment of the invention.

FIG. 8 depicts a flow chart of a process to process a cache access, which can be repeated for each cache access in the stream of cache accesses. FIG. 8 begins at step 150, in which a cache access is received. At step 152, it is determined whether the cache access is a read or write request.

If the cache access is a read request, at step 154, it is determined whether the requested element is a member of the Bloom filter ring. More specifically, such determination may involve applying a hash function to an address of the element to generate a plurality of array positions. For each of the Bloom filters, it may be determined whether bits of the Bloom filter at all the plurality of array positions are set to 1. If the bits of any one of the Bloom filters at all the plurality of array positions are set to 1, it may be determined that the element is a member of the Bloom filter ring. Otherwise, it may be determined that the element is not a member of the Bloom filter ring.

If the requested element is a member of the Bloom filter ring, a cache hit may be recorded at step 156. More specifically, a count of the number of cache hits may be incremented. If the requested element is not a member of the Bloom filter ring, a cache miss may be recorded at step 158. More specifically, a count of the number of cache misses may be incremented.

If the cache access is a write request, at step 160, it may be determined whether the element to be written is a member of the Bloom filter ring. More specifically, such determination may involve applying a hash function to an address of the element to be written to generate a plurality of array positions. For each of the Bloom filters, it may be determined whether bits of the Bloom filter at all the plurality of array positions are set to 1. If the bits of any one of the Bloom filters at all the plurality of array positions are set to 1, it may be determined that the element to be written is a member of the Bloom filter ring. Otherwise, it may be determined that the element is not a member of the Bloom filter ring.

If the element to be written is a member of the Bloom filter ring, no further action is necessary (as indicated in step 162). Otherwise, at step 164, a hash of the element is inserted into the Bloom filter indicated by the head pointer. In one embodiment, the hash of an element may be computed by calculating the hash of an address associated with the element.

In another embodiment, the hash of an element may be computed by calculating the hash of content associated with the element (i.e., hash of data block), such procedure allowing the simulation of a "deduped FIFO cache" (i.e., the simulation of a FIFO cache in which only distinct data blocks are stored in the FIFO cache). To understand the operation of deduping, if a strong hash (e.g., md5 or sha1) on the contents of two data blocks is the same, then the data blocks are essentially duplicates of one another. Therefore, if two data blocks with different addresses, but having the same content are to be recorded in a Bloom filter ring, the hash of only one of the data blocks will be written to the Bloom filter ring. Stated differently, the hash of the first data block will be written to the Bloom filter ring, and upon determining that hash of the second data block already exists in the Bloom filter ring, no write to the Bloom filter ring will occur in connection with the second data block. During a lookup, an additional index is necessary to translate the block address of a data block into a content based hash, which will be used to lookup whether the data block is present in the Bloom Filter ring.

Lastly at step 166, it is determined whether the Bloom filter indicated by the head pointer is filled to its capacity. If so, the head and tail pointer are advanced at step 168. If not, no further action is necessary (as indicated in step 170).

In one embodiment, the Bloom filter ring is implemented on DRAM 16 of the storage system. That is, storage system 10 may receive a stream of cache accesses through host interface 20, and instead of sending the stream of cache accesses to flash 12 and hard disk 14, as in an actual operation of storage system 10, the stream of cache accesses is sent to DRAM 16 (and controller 18) where the FIFO cache simulation is conducted.

Figure 9:
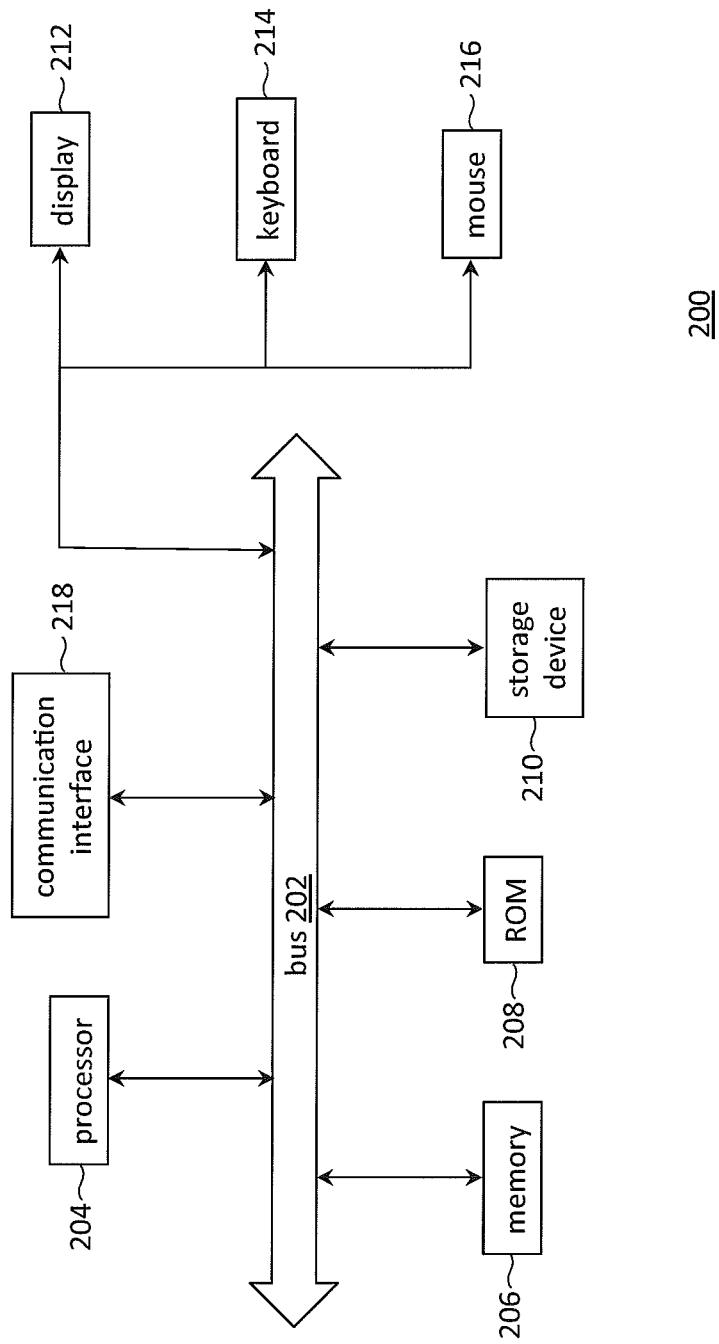
FIG. 9 depicts components of a computer system in which computer readable instructions instantiating the methods of the present invention may be stored and executed.

As is apparent from the foregoing discussion, aspects of the present invention involve the use of various computer systems and computer readable storage media having computer-readable instructions stored thereon. FIG. 9 provides an example of computer system 200 that is representative of any of the storage systems discussed herein. Further, computer system 200 is representative of FIFO cache simulator and/or a device that performs the processes depicted in FIGS. 7 and 8. Note, not all of the various computer systems may have all of the features of computer system 200. For example, certain of the computer systems discussed above may not include a display inasmuch as the display function may be provided by a client computer communicatively coupled to the computer system or a display function may be unnecessary. Such details are not critical to the present invention.

Computer system 200 includes a bus 202 or other communication mechanism for communicating information, and a processor 204 coupled with the bus 202 for processing information. Computer system 200 also includes a main memory 206, such as a random access memory (RAM) or other dynamic storage device, coupled to the bus 202 for storing information and instructions to be executed by processor 204. Main memory 206 also may be used for storing temporary variables or other intermediate information during execution of instructions to be executed by processor 204. Computer system 200 further includes a read only memory (ROM) 208 or other static storage device coupled to the bus 202 for storing static information and instructions for the processor 204. A storage device 210, which may be one or more of a floppy disk, a flexible disk, a hard disk, flash memory-based storage medium, magnetic tape or other magnetic storage medium, a compact disk (CD)-ROM, a digital versatile disk (DVD)-ROM, or other optical storage medium, or any other storage medium from which processor 204 can read, is provided and coupled to the bus 202 for storing information and instructions (e.g., operating systems, applications programs and the like).

Computer system 200 may be coupled via the bus 202 to a display 212, such as a flat panel display, for displaying information to a computer user. An input device 214, such as a keyboard including alphanumeric and other keys, is coupled to the bus 202 for communicating information and command selections to the processor 204. Another type of user input device is cursor control device 216, such as a mouse, a trackball, or cursor direction keys for communicating direction information and command selections to processor 204 and for controlling cursor movement on the display 212. Other user interface devices, such as microphones, speakers, etc. are not shown in detail but may be involved with the receipt of user input and/or presentation of output.

The processes referred to herein may be implemented by processor 204 executing appropriate sequences of computer-readable instructions contained in main memory 206. Such instructions may be read into main memory 206 from another computer-readable medium, such as storage device 210, and execution of the sequences of instructions contained in the main memory 206 causes the processor 204 to perform the associated actions. In alternative embodiments, hard-wired circuitry or firmware-controlled processing units (e.g., field programmable gate arrays) may be used in place of or in combination with processor 204 and its associated computer software instructions to implement the invention. The computer-readable instructions may be rendered in any computer language including, without limitation, C#, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ and the like. In general, all of the aforementioned terms are meant to encompass any series of logical steps performed in a sequence to accomplish a given purpose, which is the hallmark of any computer-executable application. Unless specifically stated otherwise, it should be appreciated that throughout the description of the present invention, use of terms such as "processing", "computing", "calculating", "determining", "displaying" or the like, refer to the action and processes of an appropriately programmed computer system, such as computer system 200 or similar electronic computing device, that manipulates and transforms data represented as physical (electronic) quantities within its registers and memories into other data similarly represented as physical quantities within its memories or registers or other such information storage, transmission or display devices.

Computer system 200 also includes a communication interface 218 coupled to the bus 202. Communication interface 218 provides a two-way data communication channel with a computer network, which provides connectivity to and among the various computer systems discussed above. For example, communication interface 218 may be a local area network (LAN) card to provide a data communication connection to a compatible LAN, which itself is communicatively coupled to the Internet through one or more Internet service provider networks. The precise details of such communication paths are not critical to the present invention. What is important is that computer system 200 can send and receive messages and data through the communication interface 218 and in that way communicate with hosts accessible via the Internet.

Thus, methods, systems and machine-readable media for simulating a FIFO cache using a Bloom filter ring have been described. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method, comprising:
   simulating a first-in-first-out (FIFO) cache having a first size, the simulation including:
   initializing a Bloom filter ring, Bloom filter ring including a plurality of Bloom filters arranged in a circular log, and two adjacent ones of the Bloom filters associated with a head pointer and a tail pointer, respectively;
   receiving a stream of cache accesses;
   for each of the cache accesses:
   determining whether the cache access is a read or write request;
   (a) if the cache access is a read request, determining whether an element requested by the cache access is a member of the Bloom filter ring;
   if the element requested by the cache access is a member of the Bloom filter ring, incrementing a count of a number of hits;
   (b) if the access is a write request, determining whether an element to be written is a member of the Bloom filter ring;
   if the element to be written is not a member the Bloom filter ring, inserting a hash of the element into the Bloom filter indicated by the head pointer;
   determining whether the Bloom filter indicated by the head pointer is filled to its capacity; and
   if the Bloom filter indicated by the head pointer is filled to its capacity, deleting membership of elements from the Bloom filter indicated by the tail pointer and advancing the head and tail pointers; and
   computing cache statistics including a cache hit percentage for the FIFO cache having the first size based on the count of the number of hits and a number of read requests.

2. The method of claim 1, wherein the stream of cache accesses is a sampled version of another stream of cache accesses.

3. The method of claim 1, wherein determining whether an element requested by the cache access is a member of the Bloom filter ring comprises:
   applying a hash function to an address of the element to generate a plurality of array positions;
   for each of the Bloom filters, determining whether bits of the Bloom filter at all the plurality of array positions are set to 1; and
   if the bits of any one of the Bloom filters at all the plurality of array positions are set to 1, determining that the element is a member of the Bloom filter ring;
   otherwise, determining that the element is not a member of the Bloom filter ring.

4. The method of claim 1, wherein inserting a hash of the element into the Bloom filter indicated by the head pointer comprises applying a hash function to an address of the element to generate a plurality of array positions and setting bits at all the plurality of array positions of the Bloom filter indicated by the head pointer to 1.

5. The method of claim 1, wherein inserting a hash of the element into the Bloom filter indicated by the head pointer comprises applying a hash function to contents of the element to generate a plurality of array positions and setting bits at all the plurality of array positions of the Bloom filter indicated by the head pointer to 1.

6. The method of claim 1, wherein each Bloom filter is sized to hold a first number of elements, and a Bloom filter is filled to its capacity once it holds a number of elements equal to the first number of elements.

7. The method of claim 1, wherein advancing the head and tail pointers comprises setting the head pointer equal to the tail pointer, and advancing the tail pointer to a Bloom filter adjacent to the Bloom filter just previously indicated by the tail pointer, the adjacent Bloom filter further not just previously indicated by the head pointer.

8. The method of claim 1, further comprising repeating the simulation for a plurality of FIFO based caches of various sizes and determining cache statistics including a cache hit percentage for each cache size.

9. The method of claim 8, further comprising sizing a FIFO cache of a storage system based on the cache hit percentage corresponding to each cache size.

10. A system, comprising:
a processor;
a storage device connected to the processor; and
a set of instructions on the storage device that, when executed by the processor, cause the processor to:
simulate a first-in-first-out (FIFO) cache having a first size, the simulation including:
initializing a Bloom filter ring, Bloom filter ring including a plurality of Bloom filters arranged in a circular log, and two adjacent ones of the Bloom filters associated with a head pointer and a tail pointer, respectively;
receiving a stream of cache accesses;
for each of the cache accesses:
determining whether the cache access is a read or write request;
(a) if the cache access is a read request, determining whether an element requested by the cache access is a member of the Bloom filter ring;
if the element requested by the cache access is a member of the Bloom filter ring, incrementing a count of a number of hits;
(b) if the access is a write request, determining whether an element to be written is a member of the Bloom filter ring;
if the element to be written is not a member the Bloom filter ring, inserting a hash of the element into the Bloom filter indicated by the head pointer;
determining whether the Bloom filter indicated by the head pointer is filled to its capacity; and
if the Bloom filter indicated by the head pointer is filled to its capacity, deleting membership of elements from the Bloom filter indicated by the tail pointer and advancing the head and tail pointers; and
computing cache statistics including a cache hit percentage for the FIFO cache having the first size based on the count of the number of hits and a number of read requests.

11. A non-transitory machine-readable storage medium comprising software instructions that, when executed by a processor, cause the processor to:
simulate a first-in-first-out (FIFO) cache having a first size, the simulation including:
initializing a Bloom filter ring, Bloom filter ring including a plurality of Bloom filters arranged in a circular log, and two adjacent ones of the Bloom filters associated with a head pointer and a tail pointer, respectively;
receiving a stream of cache accesses;
for each of the cache accesses:
determining whether the cache access is a read or write request;
(a) if the cache access is a read request, determining whether an element requested by the cache access is a member of the Bloom filter ring;
if the element requested by the cache access is a member of the Bloom filter ring, incrementing a count of a number of hits;
(b) if the access is a write request, determining whether an element to be written is a member of the Bloom filter ring;
if the element to be written is not a member the Bloom filter ring, inserting a hash of the element into the Bloom filter indicated by the head pointer;
determining whether the Bloom filter indicated by the head pointer is filled to its capacity; and
if the Bloom filter indicated by the head pointer is filled to its capacity, deleting membership of elements from the Bloom filter indicated by the tail pointer and advancing the head and tail pointers; and
computing cache statistics including a cache hit percentage for the FIFO cache having the first size based on the count of the number of hits and a number of read requests.

12. A method, comprising:
simulating a first-in-first-out (FIFO) cache having a first size, the simulation including:
initializing a Bloom filter ring, Bloom filter ring including a plurality of Bloom filters arranged in a circular log, and two adjacent ones of the Bloom filters associated with a head pointer and a tail pointer, respectively;
receiving a stream of cache accesses;
for each of the cache accesses:
determining whether the cache access is a read or write request;
(a) if the cache access is a read request, determining whether an element requested by the cache access is a member of the Bloom filter ring;
if the element requested by the cache access is not a member of the Bloom filter ring, incrementing a count of a number of misses;
(b) if the access is a write request, determining whether an element to be written is a member of the Bloom filter ring;
if the element to be written is not a member the Bloom filter ring, inserting a hash of the element into the Bloom filter indicated by the head pointer;
determining whether the Bloom filter indicated by the head pointer is filled to its capacity; and
if the Bloom filter indicated by the head pointer is filled to its capacity, deleting membership of elements from the Bloom filter indicated by the tail pointer and advancing the head and tail pointers; and
computing cache statistics including a cache miss percentage for the FIFO cache having the first size based on the count of the number of misses and a number of read requests.

* * * * *